United States Patent [19]

Glover et al.

[11] Patent Number: 5,168,232

[45] Date of Patent: * Dec. 1, 1992

[54] METHOD FOR RAPID MAGNET SHIMMING

[75] Inventors: Gary H. Glover, Menlo Park, Calif.; Erika Schneider, New Berlin, Wis.

[73] Assignee: General Electric Company, Milwaukee, Wis.

[*] Notice: The portion of the term of this patent subsequent to Jan. 22, 2008 has been disclaimed.

[21] Appl. No.: 546,286

[22] Filed: Jun. 29, 1990

[51] Int. Cl.⁵ ............................................. G01R 33/20
[52] U.S. Cl. ...................................... 324/320; 324/307
[58] Field of Search ................ 324/318, 319, 320, 307, 324/309

[56] References Cited

U.S. PATENT DOCUMENTS 4,740,753  4/1988  Glover et al. ......................... 324/320
4,749,948  6/1988  Duby et al. ........................... 324/320
4,987,371  1/1991  Glover et al. ......................... 324/320

Primary Examiner—Hezron E. Williams
Assistant Examiner—Howard Wisnia
Attorney, Agent, or Firm—Quarles & Brady

[57] ABSTRACT

Determination of the shimming fields for a polarizing NMR magnet is performed by acquiring two NMR images with evolution times differing by $\tau$. A pixel by pixel division of the images yields a third image whose phase is proportional to magnetic field inhomogeneity. Several such inhomogeneity images are acquired within a cylindrical volume and the data of the images is fit according to a set of polynomials approximating the fields of the magnet shim coils. The coefficients of this fitting procedure are used to set the current level in the corresponding shim coils. The interaction between correction fields is accommodated by an empirically derived correction matrix. This procedure may be repeated to provide more accurate shimming.

8 Claims, 3 Drawing Sheets ll
METHOD FOR RAPID MAGNET SHIMMING

BACKGROUND OF THE INVENTION

This invention relates to nuclear magnetic resonance (NMR) imaging methods and apparatus and more particularly to a method of shimming the magnets used with such apparatus.

In an NMR imaging sequence, a uniform polarizing magnetic field $B_O$ is applied to an imaged object along the z axis of a spatial Cartesian reference frame. The effect of the magnetic field $B_O$ is to align some of the object's nuclear spins along the z axis. In such a field the nuclei resonate at their Larmor frequencies according to the following equation:

$$\omega = \gamma B_O \qquad (1)$$

where $\omega$ is the Larmor frequency, and $\gamma$ is the gyromagnetic ratio which is constant and a property of the particular nucleus. The protons of water, because of their relative abundance in biological tissue are of primary interest in NMR imaging. The value of the gyromagnetic ratio $\gamma$ for the protons in water is about 4.26 kHz/Gauss. Therefore in a 1.5 Tesla polarizing magnetic field $B_O$, the resonance or Larmor frequency of protons is approximately 63.9 MHz.

In a two-dimensional imaging sequence, a spatial z axis magnetic field gradient ($G_z$) is applied at the time of a narrow bandwidth RF pulse such that only the nuclei in a slice through the object in a planar slab orthogonal to the z-axis are excited into resonance. Spatial information is encoded in the resonance of these excited nuclei by applying a phase encoding gradient ($G_y$) along the y axis and then acquiring a NMR signal in the presence of a magnetic field gradient ($G_x$) in the x direction.

In a typical two dimensional imaging sequence, the magnitude of the phase encoding gradient pulse $G_y$ is incremented between the acquisitions of each NMR signal to produce a view set of NMR data from which a slice image may be reconstructed. An NMR pulse sequence is described in the article entitled: "Spin Warp NMR Imaging and Applications to Human Whole Body Imaging" by W. A. Edelstein et al., *Physics in Medicine and Biology*, Vol. 25 pp. 751-756 (1980).

The polarizing magnetic field $B_O$ may be produced by a number of types of magnets including: permanent magnets, resistive electromagnets and superconducting magnets. The latter, superconducting magnets, are particularly desirable because strong magnetic fields may be maintained without expending large amounts of energy. For the purpose of the following discussion, it will be assumed that the magnetic field $B_O$ is maintained within a cylindrical magnet bore tube whose axis is aligned with the z-axis referred to above.

The accuracy of the image formed by NMR imaging techniques is highly dependant of the uniformity of this polarizing magnetic field $B_O$. Most standard NMR imaging techniques require a field homogeneity better than ±4 ppm (±250 Hz) at 1.5 Tesla over the volume of interest, located within the magnet bore.

The homogeneity of the polarizing magnetic field $B_O$ may be improved by shim coils, as are known in the art. Such coils may be axis-symmetric with the z or bore axis, or transverse to the z or bore axis. The axis-symmetric coils are generally wound around a coil form coaxial with the magnet bore tube while the transverse coils are generally disposed in a so-called saddle shape on the surface of a coil form. Each such shim coil may be designed to produce a magnetic field corresponding to one spherical harmonic ("associated Legendre polynomial") of the magnetic field $B_O$ centered at the isocenter of the magnet. In combination, the shim coils of different order spherical harmonics may correct a variety of inhomogeneities. Among the lowest order shim coils are those which produce a linear gradient along one axis of the spatial reference frame.

Correction of the inhomogeneity of the polarizing field $B_O$ involves adjustment of the individual shim coil currents so that the combined fields of the shim coils just balance any variation in the polarizing field $B_O$ to eliminate the inhomogeneity. This procedure is often referred to as shimming.

METHODS OF MEASURING INHOMOGENEITIES

Several methods of measuring the inhomogeneities of the polarizing field $B_O$, and hence deducing the necessary shim currents for each shim coil, have been used previously. In one such method, measurements of $B_O$ are made by means of a magnetometer probe which is sequentially positioned at each measurement point. The inhomogeneities of $B_O$ are determined from a number of such measurements. Repositioning the magnetometer probe between readings, however, makes this a time consuming method. Therefore, this method is most often employed in the initial stages of magnet setup when only a coarse reduction in field inhomogeneity is necessary and accordingly only a few sampled points need be taken.

Another method of measuring the inhomogeneities of the polarizing field $B_O$, is described in U.S. Pat. No. 4,740,753, entitled: "Magnet Shimming Using Information Derived From Chemical Shift Imaging", issued Apr. 26, 1988 and assigned to the same assignee as the present application. In this method ("the CSI method"), a phantom containing a uniform material (water) is used to make magnetic field measurements at specific locations ("voxels") within the phantom. A frequency spectrum is obtained at each voxel and the position of the resonance line of water is determined. The displacement of the resonance line provides an indication of the inhomogeneity at that voxel. These inhomogeneity measurements, for a limited number of points, are expanded mathematically to provide a map of the inhomogeneities over a volume within magnet bore.

The CSI method is more accurate and much faster than that of repositioning of a magnetometer probe within the bore of the magnet. Nevertheless, the CSI method has a number of shortcomings: First, the signal-to-noise ratio of the acquired spectra at each voxel must be high to provide accurate determination of the spectral peak. This in turn requires that the size of the voxels in which the inhomogeneity is determined be relatively large. The large size of the voxels reduces the spatial resolution of the inhomogeneity determination and adversely affects the calculation of the higher order shimming fields.

Second, the acquisition time for each spectrum is relatively long. As is generally understood in the art, the frequency resolution of the spectra is inversely proportional to the length of time over which the NMR signal is sampled. A sufficiently well resolved spectrum for use in the CSI method requires an NMR acquisition time on the order of one half second for each voxel.

This may be contrasted with the approximately 8 ms readout per 256 voxels required in an ordinary NMR imaging scan. As a result, the acquisition of data for the above CSI method requires approximately 5 minutes per 16 by 16 voxel image, a relatively long time.

Third, the processing of the spectra to determine the frequency location of each spectrum's peak also requires a substantial amount of time.

SUMMARY OF THE INVENTION

The present invention relates to a method of measuring the inhomogeneities of a polarizing magnetic field $B_O$ directly from two conventional NMR images having different phase evolution times. The inhomogeneity data so derived may be expanded against polynomials approximating the fields produced by the shim coils. The coefficients of this expansion may be used to determine the setting of the currents in the shim coils necessary to correct the inhomogeneity.

Specifically, a first and second NMR view set is acquired with a first and second, different evolution time $t_{E1}$ and $t_{E2}$. A gradient echo or spin echo pulse sequence may be used. A corresponding first and second complex multipixel image is reconstructed from each NMR view set, and these two images are divided, one by the other on a pixel by pixel basis, to produce a complex multipixel ratio image. The argument of this complex multipixel ratio image provides an inhomogeneity map of the polarizing magnetic field, from which the compensating energization of the shim coils may be determined.

The method of adjusting the shim coils may include fitting the inhomogeneity map over a volume of interest to a set of polynomials which approximate the fields produced by the shim coils. The value of the coefficients of these polynomials after the expansion will approximate the required shim coil currents. Also, a calibration matrix describing the deviation of the fields produced by each shim coil from the associated polynomial may be determined and used in conjunction with the coefficients of the polynomials to adjust the energization of the shim coils.

It is one object of the invention, therefore, to decrease the time needed to shim a NMR magnet from that required by the previously described CSI method. The use of two standard NMR view images rather than the chemical shift image spectra used in the CSI method reduces the data acquisition time substantially with vastly increased resolution. The subsequent processing of the acquired image data to determine the inhomogeneity is also faster than the peak finding procedure of the CSI method.

It is another object of the invention to provide an inhomogeneity measurement with better spatial resolution than the CSI method. The method of the present invention is less sensitive to the signal-to-noise ratio of the NMR view images and hence the inhomogeneity of smaller voxels may be measured.

Other objects and advantages besides those discussed above shall be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

DETAILED DESCRIPTION OF THE INVENTION

Figure 1:
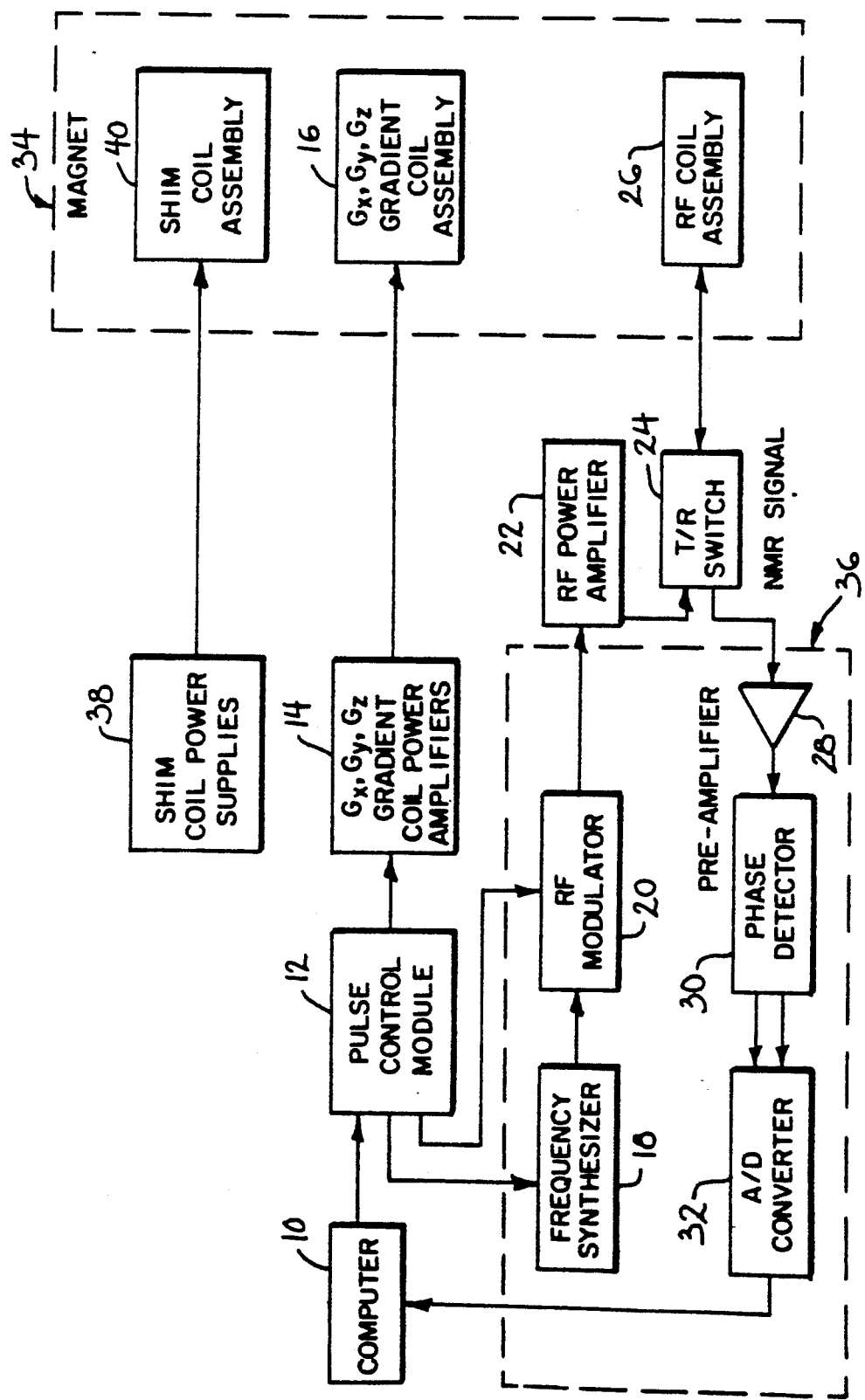
FIG. 1 is a schematic block diagram of an NMR system suitable for the practice of this invention.

FIG. 1 is a block diagram of an NMR imaging system of a type suitable for the practice of the invention. It should be recognized, however, that the claimed invention may be practiced on any suitable apparatus.

A computer 10 controls a pulse control module 12 which in turn controls gradient coil power amplifiers 14. The pulse control module 12 and the gradient amplifiers 14 together produce the proper gradient waveforms $G_x$, $G_y$, and $G_z$, as will be described below, for a gradient echo pulse sequence. The gradient waveforms are connected to gradient coils 16 which are positioned around the bore of the magnet 34 so that gradients $G_x$, $G_y$, and $G_z$ are impressed along their respective axes on the polarizing magnetic field $B_O$ from magnet 34.

The pulse control module 12 also controls a radio frequency synthesizer 18 which is part of an RF transceiver system, portions of which are enclosed by dashed line block 36. The pulse control module 12 also controls a RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by an high speed A/D converter 32 and passed to computer 10 for processing to produce NMR images of the object.

A series of shim coil power supplies 38 provide current to shim coils 40. Each shim coil may generate a magnetic field which can be described in terms of spherical harmonic polynomials. The first order shim fields can be produced by either the gradient coils 16 or the shim coils 40, with higher order shim fields produced by the shim coils 40 only.

ISOLATING INHOMOGENEITY DATA FROM NMR IMAGES

The following discussion considers a gradient echo pulse sequence produced on the above described apparatus and suitable for use with the present invention. It should be understood, however, that the invention may be used with other pulse sequences as will be apparent from the following discussion to one of ordinary skill in the art.

Figure 2:
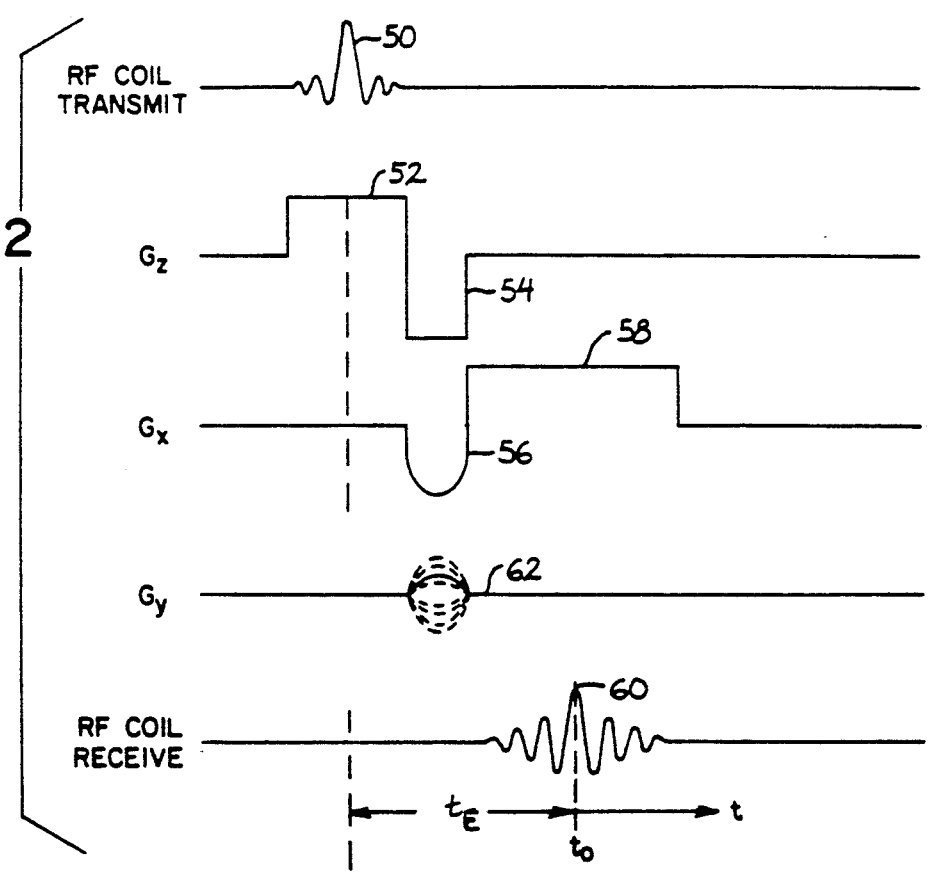
FIG. 2 is a graphic representation of a gradient echo NMR pulse sequence.

Referring to FIG. 2, a gradient echo pulse sequence begins with the transmission of a narrow bandwidth radio frequency (RF) pulse 50 in the presence of slice selection $G_z$ pulse 52. The energy and the phase of this initial RF pulse may be controlled such that at its termination the magnetic moments of the individual nuclei are aligned in the x-y plane of a rotating reference frame of the nuclear spin system. A pulse of such energy and duration is termed a 90° RF pulse. The rotating frame differs from the previously described spatial reference frame in that the rotating frame rotates about the spatial z-axis at a frequency $\omega_O$ equal to the Larmor frequency of the dominant proton species without any additional shim fields.

The result of the combined RF signal and gradient pulse 52 is that the nuclear spins of a narrow slice in the three dimensional imaged object along spatial z-plane are excited. Only those spins with a Larmor frequency, under the combined field $G_z$ and $B_O$, within the frequency bandwidth of the RF pulse will be excited. Hence the position of the slice may be controlled by the gradient $G_z$ intensity and the RF frequency.

A negative $G_z$ rewinder gradient pulse 54, serves to rephase the nuclear spins in the x-y plane of the rotating frame. Rewinder pulse 54 therefore is approximately equal to half the area of that portion of slice select gradient 52 which occurs during the RF pulse 50.

After or during the application of the $G_z$ rewinder pulse 54, the $G_x$ prewinder pulse 56 is applied. The prewinder pulse 56 begins to dephase the precessing nuclei: those nuclei at higher spatial locations within the slice advance in phase faster as a result of the $G_x$-induced higher Larmor frequency than those nuclei at lower spatial locations. Subsequently, a positive $G_x$ readout pulse 58, centered at time $t_E$ after the center of RF pulse 50 causes the dephased spins to rephase into a gradient echo or NMR signal 60 at or near the center of the read-out pulse 58. The gradient echo 60 is the NMR signal for one row or column in the image.

In a two dimensional imaging sequence, a gradient pulse $G_y$ 62 is applied to phase encode the spins along the y axis during the prewinder gradient 56. The sequence is then repeated with different $G_y$ gradients, as is understood in the art, to acquire an NMR view set from which a tomographic image of the imaged object may be reconstructed according to conventional reconstruction techniques.

The NMR signal 60 is the sum of the component signals from many precessing nuclei throughout the excited slice. Ideally, the phase of each component signal will be determined by the strength of the $G_z$, $G_x$ and $G_y$ gradients at the location of the individual nuclei during the read out pulse 58, and hence by the spatial z-axis, x-axis and y-axis locations of the nuclei. In practice, however, numerous other factors affect the phase of the NMR signal 60.

For the purposes of simplifying the following discussion of NMR signal phase, it will be assumed that the object being imaged has no variation in the y direction. The NMR signal 60 may be then represented as follows:

$$S(t) = \int \rho(x) e^{i\gamma G_x x t} \cdot e^{i\gamma B_O(t_E+t)} \cdot e^{i\Omega(x)(t_E+t)} \cdot e^{i\phi} dx \quad (2)$$

where $\rho(x)$ is the spin density, i.e. the number of nuclei at a given voxel in the x direction; $\gamma$ is the gyromagnetic constant of the nuclei of the material being imaged; $B_O$ is the strength of the polarizing magnetic field; $G_x$ is the slope of the x axis gradient and $t_E$ is the phase evolution time described above.

The first complex term of this integral, $e^{i\gamma G_x x t}$, represents the effect of the readout gradient 58 on the NMR signal S(t). The gradient prewinder 56, causes this effect to be referenced not from the start of the gradient pulse 58 but from $t_O$ the center of the gradient pulse 58 as shown in FIG. 2.

The second complex term of this equation, $e^{i\gamma B_O(t_E+t)}$, represents the effect of the polarizing field $B_O$ on the NMR signal S(t). $B_O$ is continuously present and hence, in the gradient echo pulse sequence, the effect of $B_0$ on S(t) is measured from the instant of occurrence of the RF pulse 50. The time elapsed since the RF pulse 50, in the gradient echo pulse sequence is $t_E+t$ as shown in FIG. 2.

The third complex term of this equation, $e^{i\Omega(x)(t_E+t)}$, arises from inhomogeneities in the magnetic field $B_O$. These inhomogeneities are generally spatially variable and may be derived from the second complex term of equation (2). Specifically $e^{i\gamma B_O(t_E+t)}$ becomes $e^{i\gamma(B_O+\Delta B(x))(t_E+t)}$ where $\Delta B(x)$ is the inhomogeneity of $B_O$ and generally a function of x. This inhomogeneity function may be factored into a separate complex term $e^{i\Omega(x)(t_E+t)}$ where $\Delta(x)=\gamma\Delta b$ and $\Delta$ is termed the actual inhomogeneity. The phase error of such inhomogeneities in $B_O$ increases for increasing phase evolution time and hence this term is a function of $t_E+t$, for the same reasons as those described above for the second complex term of equation (2).

The fourth complex term of this equation, $e^{i\phi}$, collects phase lags or leads resulting from the signal processing of the NMR signal chain. For example, the RF coil structure 26, shown in FIG. 1, may introduce certain phase distortions as may the RF power amplifier 22 and the preamplifier 28. These phase terms may also vary with x and are represented by the term $e^{i\phi}$.

This equation (2) may be simplified by recognizing that the NMR signal is typically hetrodyned or shifted in frequency to remove the base frequency of water polarized by the magnetic field $B_O$. This frequency shift transformation is accomplished by multiplying S(t) by $e^{-i\gamma B_O(t_E+t)}$ producing the signal S'(t):

$$S'(t) = \int \rho(x) e^{i\gamma G_x x t} \cdot e^{i\Omega(x)(t_E+t)} \cdot e^{i\phi} dx \quad (3)$$

The following substitution is now made to simplify the reverse Fourier transformation necessary to produce an image from S'(t):

$$x + x' - \Omega(x)/\Omega G_x \quad (4)$$

yielding $$S'(t) = e^{i\phi} \cdot \int \rho(x' - \Omega(x)/\Omega G_x) e^{i\gamma G_x x' t} \cdot e^{i\Omega(x')(t_E)} dx' \quad (5)$$

The reconstruction, as mentioned, is performed by performing the reverse Fourier transform upon S'(t) to derive a complex, multipixel image P(x)':

$$\begin{aligned} P(x)' &= \int S'(t) e^{-i\gamma G_x x t} dt \\ &= e^{i\phi} \cdot (\rho(x' - \Omega(x)/\gamma G_x) \cdot e^{i\Omega(x')(t_E)} \end{aligned} \quad (6)$$

The pixels of the image $P(x)'$ are displaced from their true positions $x$ by the terms used in the substitution given in equation (4), however this displacement may be ignored if the displacement is on the order of one pixel. A displacement of less than one pixel will result if the inhomogeneity $\Delta B$ of the magnetic field $B_O$ is small relative to the gradient strength $G_x$. Specifically if $\Omega(x)/\gamma G_x <$ one pixel or by the previous definition of $\Omega(x)$ in terms of $\Delta B$, $\Delta B(x)/G_x <$ one pixel. For a 1.5 Tesla magnet with a $B_O$ field of approximately 500,000 times the increment in gradient field per pixel, the pixel displacement will be on the order of one pixel if the magnet has an initial homogeneity of 2 ppm. The term $\omega_F/\gamma G_x$ is then approximately 1.7 and may be ignored in areas of the imaged object where there there is little change in the signal from pixel to pixel as will generally be the case with a phantom. As will be described further below, the expansion process will tend to further decrease error resulting from occasional deviations from these assumptions.

Assuming the pixel displacements may be ignored, equation (6) becomes:

$$P(x)' = \rho(x) e^{i\Omega(x)(tE)} \cdot e^{i\phi} \qquad (7)$$

The inhomogeneity data $\Omega$ may be extracted by performing two experiments and producing two signals $P_1(x)$ and $P_2(x)$ with two different evolution times $t_{E1}$ and $t_{E2}$. The difference between $t_{E1}$ and $t_{E2}$ will be termed $\tau$ and its selection is arbitrary subject to the following constraints: larger values of $\tau$ increase the resolution of the measurement of inhomogeneity but cause the inhomogeneity data $\Omega$ to "wrap around" with large magnetic field inhomogeneities. Conversely, smaller values of $\tau$ decrease the resolution of the measurement of inhomogeneity but permit the measurement of larger magnet inhomogeneities without "wrap around". Wrap arounds results from the periodicity of the trigonometric functions used to calculate the inhomogeneity data $\Omega$ as will be described in more detail below.

For these two experiments with different evolution times $t_{E1}$ and $t_{E2}$:

$$P_1(x) = \rho(x) e^{i\Omega(x)(tE1)} \cdot e^{i\phi}, \qquad (8)$$

and $$\begin{aligned} P_2(x) &= \rho(x) e^{i\Omega(x)(tE2)} \\ &= \rho(x) e^{i\Omega(x)(tE1+\tau)} \\ &= P_1 e^{i\Omega(x)\tau} \end{aligned} \qquad (9)$$

A third image $P_3$ may be then produced by dividing image $P_2$ by $P_1$, on a pixel by pixel basis, such that $$P_3(x) = \frac{P_2}{P_1} = e^{i\Omega(x)\tau} \qquad (10)$$

$$\Delta\phi(x) = arg(P_3(x)) \qquad (11)$$

Thus $P_3$ is an image whose argument $\Delta\phi$, (the angle of the complex number $e^{i\Omega(x)\tau}$) is proportional to the inhomogeneity $\Omega(x)$. The inhomogeneity $\Omega(x)$ may be calculated at any point $x$ by dividing $\Delta\phi(x)$, the argument of $P_3(x)$ at the pixel associated with $x$, by $\tau$.

As has now been described, the argument $\Delta\phi(x)$ of the complex image $P_3$ divided by $\tau$ yields a map of the inhomogeneity $\Omega(x)$ over the image $P_3$'s surface. The complex array $P_3$ is represented digitally within the NMR system by means of two quadrature arrays indicating the magnitudes of sine and cosine terms of $P_3$ respectively. The argument or phase angle of $P_3$ may be extracted by application of the arctangent function to the ratio of these quadrature arrays. The arctangent function has a range of $-\pi$ to $+\pi$ and therefore the argument of $\Delta\phi(x)$ will be limited to values within this range. The measured inhomogeneity $\Omega'$ is equal to the argument $\Delta\phi$ divided by $\tau$ and therefore the measured inhomogeneity value $\Omega'$ will be restricted to the range $-\pi/\tau$ to $+\pi/\tau$. For values of the actual inhomogeneity $\Omega$ outside of this range, $\Omega'$ will "wrap around".

Figure 3A:
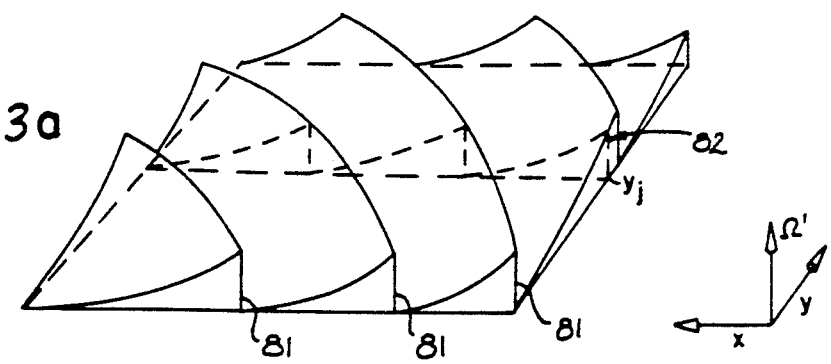
FIG. 3(a) is a three dimensional graph of measured inhomogeneity $\Omega'$ over an area of an x-y plane.

Referring to FIG. 3(a) an example map of measured inhomogeneity $\Omega'(x,y)$ 80 over a two dimensional image $P_3(x,y)$ is shown with $\Omega'(x,y)$ plotted in the vertical dimension. The actual inhomogeneity $\Omega(x,y)$ increases monotonically over the surface $P_3$, however, as explained, the measured inhomogeneity $\Omega'(x,y)$ is bounded between the arctangent imposed limits of $-\pi/\tau$ to $+\pi/\tau$. Accordingly, discontinuities 81 occur at the points where the arctangent function is discontinuous at $\pi$ and $-\pi$. The actual inhomogeneity $\Omega(x,y)$ may be determined by "unwrapping" the discontinuities, a complex topological problem that requires tallying the discontinuities as one moves over the surface of the $P_3(x,y)$ argument array 80 and adding or subtracting $2\pi$ to the measured inhomogeneity $\Omega'$ as each discontinuity 81 is passed.

This difficult tallying procedure may be avoided, provided that the image object has only one proton species, as would be the case with a phantom used for shimming, if $\tau$ is chosen to be small enough to eliminate wrap arounds. Specifically, $$\tau \leq \frac{1}{\Delta\nu},$$

where $\Delta\nu$ is the frequency spread of the resonating protons across the measured volume caused by the magnet inhomogeneity. Once the initial inhomogeneity is corrected with this small value of $\tau$, the process may be repeated with larger $\tau$'s to improve the resolution of the inhomogeneity measurement for subsequent iterations.

CORRECTING WRAP AROUNDS

Alternatively, the wrap arounds may be detected and corrected by taking the spatial partial derivatives of the measured inhomogeneity map 80.

Figure 3B:
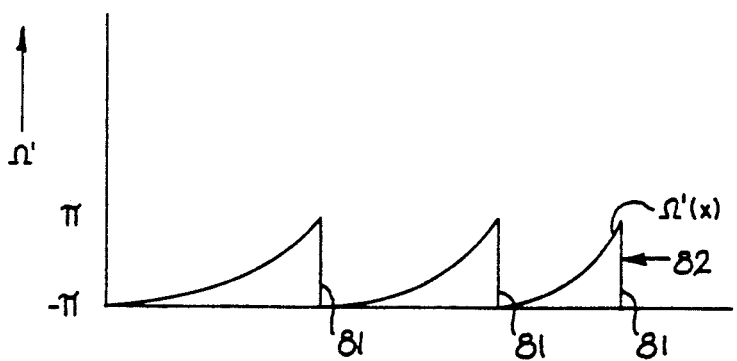
FIG. 3(b) is graph of measured inhomogeneity $\Omega'$ versus x taken along a line of constant y through the three dimensional graph shown in FIG. 3(a)

Referring to FIG. 3(b), the values 82 of the measured inhomogeneity map $\Omega'(x,y)$ 80, along a line parallel to the x-axis, are shown. Curve 82 rises with increasing $\Omega'$, associated with increasing values x, until the $\Omega'$ reaches $+\pi/\tau$ at which point it jumps to $-\pi/\tau$ as a result of the previously discussed discontinuities at $\pi$ and $-\tau$.

Figure 3C:
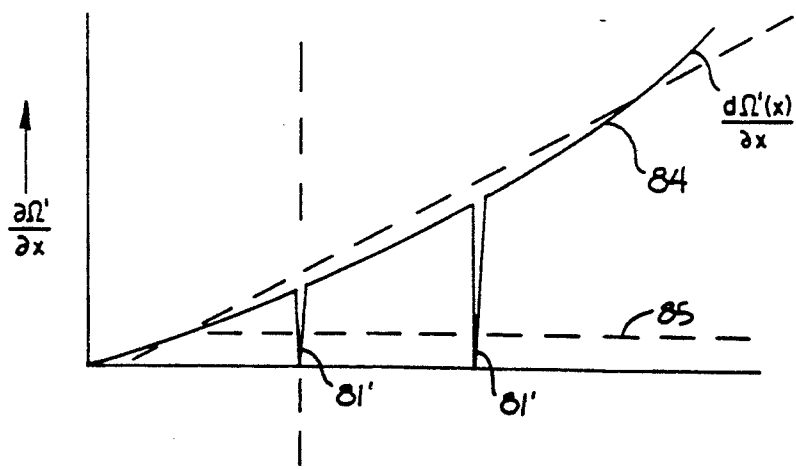
FIG. 3(c) is a graph of the partial derivative of the function graphed in FIG. 3(b), showing the determination of the points of discontinuity by a thresholding process.
Figure 3D:
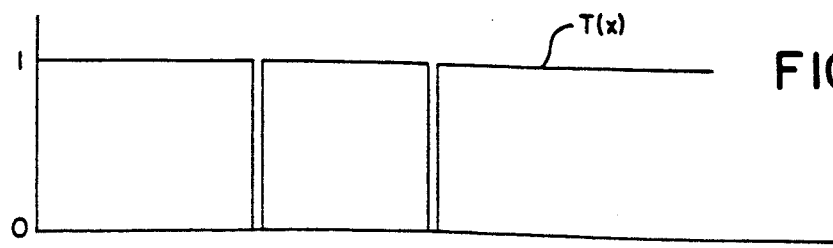
FIG. 3(d) is a graph of the weighting function T(x) used to reduce the discontinuities of the partial derivative of FIG. 3(c) during curve fitting of shim fields.

A first partial derivative, $\delta\Omega'/\delta x$, along line 82 is shown in FIG. 3(c). The partial derivative exhibits "spikes" 81' at the points of discontinuity 81 in FIG. 3(b). These points of discontinuity may be readily detected by comparing curve 84 to a threshold value 85 and creating a weighting function $T(x)$, as shown in FIG. 3(d), whose value is zero when the magnitude of curve 84 is greater than the threshold value 85 and one otherwise. The threshold is preferably set to $\pi/8\tau$ although other values may be used. The phase weighting function, T(x) is then used to fit the derivative inhomogeneity data to spatial derivatives of the spherical harmonic polynomials as will be described below.

In a further embodiment, an amplitude weighting function W(x,y) is also constructed such that the amplitude weighting function W(x,y) equals zero when the magnitude of image value $P_3$ is less than a second threshold value and one otherwise. The second threshold is set to 15% of the maximum signal magnitude within the area of the image under consideration, although other values could be selected depending on the signal to noise ratio of the image. The amplitude weighting function is used to diminish the importance during expansion of the inhomogeneity map in areas where there is little signal strength, as indicated by the magnitude of $P_3$, and hence serves to eliminate incoherent, irrelevant phase wrap arounds arising from regions with no amplitude. As will be apparent to one of ordinary skill in the art, the weighting function W(x) may be implemented in numerous other ways. For example, W(x) may be a continuous function of the magnitude of the image or the power of the image $(P)^2$.

CORRECTING FOR OFF CENTER TERMS

The associated Legendre polynomials may be fit to the inhomogeneity data by a weighted least squares method using weighting functions T and W as described above and as is understood in the art. If $\tau$ is chosen such that no wrap arounds occur, then the inhomogeneity data is fit to the appropriate associated Legendre polynomials directly. If $\tau$ is chosen such that wrap arounds do occur, the wrap arounds are removed as described above and the resultant differentiated inhomogeneity data is fit to the appropriate differentiated associated Legendre polynomials.

A straight forward least squares fitting of the data in this manner carries the implicit assumption that the inhomogeneities are centered at the isocenter of the magnet. This will not always be the case however, and if the inhomogeneities are off center, the coefficients so determined will include errors if the full complement of appropriate Legendre polynomials are not used in the field correction. This distortion of the fitting may be corrected, if the offset is known, by spatially shifting the associated Legendre polynomials by the amount that the inhomogeneities are off center. Specifically, a Taylor expansion of each polynomial is performed by substituting the variables $x-x_O$, $y-y_O$, and $z-z_O$ for x, y, z, where $x_O$, $y_O$, and $z_O$ are the distances by which the center of the inhomogeneities are offset from the isocenter. This procedure effectively shifts the polynomials so that they are centered on the inhomogeneity prior to the fitting process being performed.

It has been determined that the inhomogeneities tend to be centered on the center of mass of the imaged object. This follows from the effect that the presence of the imaged object has on the magnetic field lines. Accordingly the center of mass of the imaged object is first determined from the amplitude of the image $S_O(x,y)$. Specifically, for the x-axis:

$$x_O = \frac{\int |S_O(x,y)| x\, dx\, dy}{\int |S_O(x,y)| dx\, dy} \tag{12}$$

The values of $y_O$ and $z_O$ are determined in a similar manner.

DETERMINATION OF SHIM SETTINGS

The inhomogeneity data acquired in the above manner may be used to determine the proper settings of the shim coils. The technique of determining the setting of the shim coils from inhomogeneity data is described in detail in the previously cited U.S. Pat. No. 4,740,753 at column 6 lines 62 et seq. and is hereby incorporated by reference. This process is summarized as follows:

The inhomogeneity data or derivative data corrected by the weighting function provides a set of inhomogeneity measurements within a plane determined by the gradients of the imaging sequence of FIG. 2. Additional data is obtained for planes rotated about the z-axis by 45°, 90°, and 135° to provide inhomogeneity measurements within the volume of a cylinder radial symmetric about the z-axis. The rotation of the imaging plane is obtained by simultaneous excitation of the gradients with various factors applied to the amplitudes as known in the art.

This collection of inhomogeneity measurements may be expanded throughout a volume of interest as a series of spherical harmonics or the spatial derivatives thereof. A variety of polynomials may be used, however, the polynomials are preferably related to the fields produced by the shim coils 40. In the imaging system of FIG. 1, the shim coils 40 are designed to produce fields approximating those described by orthonormal associated Legendre polynomials and hence associated Legendre polynomials ("spherical harmonic polynomials") or their spatial derivatives (if the above unwrapping procedure was used) are used for the calculation of the currents to be applied to the shim coils. The above process involves fitting the inhomogeneity measurements to the polynomials or their spatial derivatives by adjusting the coefficients of the polynomials according to a least squares minimization or other well known curve fitting process.

Once this process is completed, the coefficients of the polynomials may be used to set the currents in the shim coils to correct the inhomogeneity per a calibration matrix as will be now described.

Ideally the fields of the shim coils 40 are designed to be orthonormal, that is, each will correct a different component in the spherical harmonic polynomial. In this case the currents in the shim coils 40 would be proportional to the coefficients of the corresponding polynomials. However, to the extent that there is some interaction between the fields produced by the shim coils 40, i.e, a given shim coil 40 produces magnetic field components in other harmonics than its own, a calibration matrix must be determined. The calibration matrix is produced by measuring, individually, the effect of each shim coil 40 on the magnetic field homogeneity. The currents in the shim coils may be then determined by means of the calibration matrix and the polynomial coefficients. Any remaining error may be corrected by repeating the entire process for several iterations.

While this invention has been described with reference to particular embodiments and examples, other modifications and variations, such as application to projection reconstruction imaging techniques, will occur to those skilled in the art in view of the above teachings. For example, the technique may be used with a phantom containing two chemical species or for in-vivo shimming making use of the techniques taught in co-pending U.S. patent application Ser. No. 07/441,850, filed Nov. 27,1989, entitled: "Method For In-Vivo Shimming" and assigned to the same assignee as the present invention. Also, pulse sequences other than gradient echo pulse sequences may be used, as will be understood from this discussion and a review of the techniques taught in the previously cited application. Accordingly, the present invention is not limited to the preferred embodiment described herein, but is instead defined in the following claims.

We claim:

1. A method of correcting the spatial variation in a magnetic field produced by a magnet system with an isocenter having a means for producing a main polarizing magnetic field and a plurality of shim coils for producing auxiliary magnetic fields when energized, to compensate for the inhomogeneities in the polarizing magnet field, said method comprising the steps of:

acquiring a first NMR view set, of an imaged object having a predeominate, single Larmor frequency, with a first evolution time tE1;

acquiring a second NMR view set of the imaged object with a second evolution time tE2 different from the first evolution time;

reconstructing a first and second complex multipixel image from each NMR view set;

dividing the value of each pixel of the first complex multipixel image, on a pixel by pixel basis, to produce a complex multipixel ratio image;

calculating the argument of each pixel of the complex multipixel ratio image to produce an inhomogeneity map; and adjusting the energization of the shim coils to reduce the inhomogeneity indicated by the inhomogeneity map.

2. The method of claim 1 where the step of adjusting the energization of the shim coils includes the steps of:

fitting the inhomogeneity map over a volume of interest to a set of polynomials approximating the fields produced by the shim coils, the polynomials having coefficients; and adjusting the current in the shim coils in proportion to the coefficients of the associated polynomial.

3. The method of claim 2 where the polynomials are associated Legendre polynomials.

4. The method of claim 2 including the step of:

determining a calibration matrix describing the deviation of the field produced by each shim coil from the polynomial; and adjusting the current in the shim coils in proportion to the coefficients of the associated polynomial and the calibration matrix.

5. The method of claim 1 where the NMR view sets are acquired by a gradient echo pulse sequence.

6. The method of claim 1 including the step of removing wrap arounds in the inhomogeneity map by:

taking the partial derivative of the inhomogeneity map along a shim axis to produce a differentiated inhomogeneity map;

producing a discontinuity weighting function that assigns zero weight to points of the differentiated inhomogeneity map that have values outside of a predetermined range; and where the energization of the of the shim coils is adjusted by performing a weighted curve fitting to the differentiated inhomogeneity map to determine a correcting shim field.

7. The method of claim 2 where the inhomogeneity map is fit over the volume of interest by use of a Taylor expansion of the associated polynomial, the Taylor expansion incorporating an offset equal to the difference between the center of mass of the imaged object and the isocenter of the magnet.

8. A method of correcting the spatial variation in a magnetic field produced by a magnet system with an isocenter having a means for producing a main polarizing magnetic field and a plurality of shim coils for producing auxiliary magnetic fields when energized, to compensate for the imhomogeneities in the polarizing magnet field, said method comprising the steps of:

acquiring a first NMR view set of an imaged object with a first evolution time TE1;

acquiring a second NMR view set of the imaged object with a second evolution time tE2 different from the first evolution time;

reconstructing a first and second complex multipixel image from each NMR view set;

dividing the value of each pixel of the first complex multipixel image by the corresponding value of the pixel of the second multipixel image, on a pixel by pixel basis, to produce a complex multipixel ratio image;

calculating the argument of each pixel of the complex multipixel ratio image to produce an inhomogeneity map; and adjusting the energization of the shim coils to reduce the inhomogeneity indicated by the inhomogeneity map by:

(1) fitting the inhomogeneity map over a volume of interest by use of a Taylor expansion of a polynomial having coefficients and approximating the fields produced by the shim coils, the Taylor expansion incorporating an offset equal to the difference between the center of mass of the imaged object and the isocenter of the magnet; and (2) adjusting the current in the shim coils in proportion to the coefficients of the polynomial.

* * * * *

UNITED STATES PATENT AND TRADEMARK OFFICE
CERTIFICATE OF CORRECTION

PATENT NO. : 5,168,232
DATED : December 1, 1992
INVENTOR(S) : Glover et al.

Page 1 of 2

It is certified that error appears in the above-indentified patent and that said Letters Patent is hereby corrected as shown below:

Col. 6, line 10     "$e^{i\gamma B_0 t_E + t)}$" should be --$e^{i\gamma B_0 (t_E+t)}$--.

Col. 6, line 23     "$(t_E^{+t})$" should be --$(t_E+t)$--.

Col. 6, line 26     "$\Delta(x)=\gamma\Delta b$ and $\Delta$" should be
                   -- $\Omega(x)=\gamma\Delta B$ and $\Omega$ --.

Col. 6, line 53     "$x+x'-\Omega(x)/\Omega Gx$" should be --$x=x'-\Omega(x)/\gamma Gx$--.

Col. 6, line 58
"$S'(t)=e^{i\phi} \cdot \int P(x'-\Omega(x)/\gamma Gx)e^{i\gamma G_x x' t} \cdot e^{i\Omega(x')(tE)} \, dx'$"

should be --$S'(t)=e^{i\phi} \cdot \int p(x'-\Omega(x)/\gamma Gx)e^{i\gamma G_x x' t} \cdot e^{i\Omega(x')(t_E)} \, dx'$--

Col. 8, line 59     "and -$\tau$." should be --and -$\pi$--.

UNITED STATES PATENT AND TRADEMARK OFFICE
CERTIFICATE OF CORRECTION

PATENT NO. : 5,168,232
DATED : December 1, 1992
INVENTOR(S) : Glover et al.

It is certified that error appears in the above-indentified patent and that said Letters Patent is hereby corrected as shown below:

Col. 11, line 19     "predeominate" should be --predominate--.

Col. 11, line 28     after "image" and before ", on a pixel" insert --by the corresponding value of the pixel of the second multipixel image--.

Signed and Sealed this

Twenty-eighth Day of December, 1993

Attest:

BRUCE LEHMAN

Attesting Officer          Commissioner of Patents and Trademarks